United States Patent
Wadland et al.

(10) Patent No.: US 7,620,922 B1
(45) Date of Patent: Nov. 17, 2009

(54) METHOD AND SYSTEM FOR OPTIMIZED CIRCUIT AUTOROUTING

(75) Inventors: Ken Wadland, Grafton, MA (US); Richard Woodward, San Diego, CA (US); Randall Lawson, Westford, MA (US); Greg Horlick, Madison, AL (US)

(73) Assignee: Cadence Design Systems, Inc., San Jose, CA (US)

( * ) Notice: Subject to any disclaimer, the term of this patent is extended or adjusted under 35 U.S.C. 154(b) by 273 days.

(21) Appl. No.: 11/556,999

(22) Filed: Nov. 6, 2006

(51) Int. Cl.
*G06F 17/50* (2006.01)
*G06F 9/45* (2006.01)

(52) U.S. Cl. .................. 716/9; 716/2; 716/4; 716/5; 716/10; 716/18

(58) Field of Classification Search .......... 716/8–15, 716/2, 4–5, 18
See application file for complete search history.

(56) References Cited

U.S. PATENT DOCUMENTS 6,363,518 B1 * 3/2002 Lee ........................... 716/10
7,194,720 B1 * 3/2007 Borer et al. .................... 716/16

* cited by examiner

*Primary Examiner*—Thuan Do
*Assistant Examiner*—Nghia M Doan
(74) *Attorney, Agent, or Firm*—Rosenberg, Klein & Lee

(57) ABSTRACT

An approach is provided for selectively optimizing a circuit design, including generating a circuit routing solution according to a plurality of constraints for parametric resources of the circuit design, with the constraints being defined respectively by a plurality of corresponding constraint instances. Each constraint instance variably indicates an effective constraining limit and degree of consumption for at least one of the parametric resources. At least one of the constraints is selectively adjusted by a predetermined over-constraining amount, and the circuit routing solution is preliminarily modified by applying at least one routing action selected responsive to the constraint adjustment. The potential impact upon constraint compliance is evaluated, including generating a relative cost measure for the preliminary modification of the circuit routing solution, based at least partially upon each of the constraint instances. Thereafter, the preliminary modification of the circuit routing solution is either discarded or accepted responsive to the evaluation.

34 Claims, 11 Drawing Sheets

MAIN LOOP

COMPLIANCE FUNCTION , COMPLIANCE LEVEL=100%

COMPLIANCE FUNCTION, COMPLIANCE LEVEL > 100%

COST FUNCTION, GOAL LEVEL > 100%

LINEAR COST FUNCTION WITH STEPPED FLOOR, GOAL LEVEL > 100%

S-CURVE COST FUNCTION, GOAL LEVEL > 100%

METHOD AND SYSTEM FOR OPTIMIZED CIRCUIT AUTOROUTING

BACKGROUND OF THE INVENTION

1. Field of the Invention

The subject method and system for optimized circuit autorouting is generally directed to the reliable optimization of an autorouted circuit design. More specifically, the method and system serves to enable selective optimization of an interconnect solution obtained by autorouting while automatically guarding against adverse impact upon the interconnect solution's degree of adherence to applicable design constraints. The subject method and system enable one or more selected constraints pertaining to the autorouted circuit design to be 'safely' tightened, thereby improving the autorouted circuit design in measurable terms without jeopardizing its compliance with all applicable design rules and constraints. Programmably implemented measures are taken to recursively enhance a level of optimization relative to user-defined constraints attained by an interconnect solution for the given circuit design, without forfeiting any prior gains made in that regard.

With the advent of printed circuit boards (PCBs) and electronic design automation (EDA), manufacturers have relied increasingly upon autorouter systems to generate, to the extent possible, interconnect solutions for implementing the given circuit designs consistent with all design requirements. Such an autorouter system generally receives as inputs a set of electrical terminals, a net list formed by a set of connections between the terminals, and a set of user-defined constraint instances. The autorouter system operates to generate an interconnect solution which contains a set of routes for the connections defined so as to meet all constraint instances and other applicable design rules. Once it generates an interconnect solution, however, the autorouter system invariably ceases execution.

While an interconnect solution thus generated by an autorouter system may suffice at that stage to meet minimum requirements, it may still fall far short of the optimum circuit design actually permitted by those requirements. For example, an interconnect solution which just manages to satisfy all constraint instances and establish all necessary connections between terminals, may not be sufficiently tolerant to certain unavoidable factors bearing on the circuit design, like manufacturing variations, environmental conditions, material properties, or other factors that the given circuit will be subjected. Moreover, the solution may not leave ample 'room' for statistical variations inherent to certain constraint instances.

Circuit designers have consequently tended to over-constrain their circuit designs, artificially specifying limits for constraint instances well beyond that which is electrically required. This practice, coupled with a steady increase in the number of constraints imposed upon a circuit design over the past decades, has often led to over-constrained systems for which an interconnect solution meeting all applicable constraints is not even theoretically possible.

In those cases where they have not altogether abandoned the use of an autorouting system in favor of manual routing for the design, circuit designers have also taken to post-optimizing an autorouted interconnect solution themselves. Consulting the expertise of colleagues in other disciplines (electrical engineering, signal integrity engineering, . . . ), the circuit designer will manually evaluate then tighten or relax certain constraint instances towards a 'better' if not 'best' solution. This is not without prohibitive challenges.

The autorouting of PCBs early on focused primarily upon minimizing path lengths between connecting pins together to form nets. This necessitated relatively few, mostly distance-based, design rules such as minimum track widths, minimum clearance between objects, and the like. As operational parameters like clock speeds increased, however, additional constraints of timing-based, voltage-based, and other type became increasingly necessary to the point where, in many applications today, most if not all the nets of a circuit design are subject to multiple, often inter-dependent constraints.

The increasing sophistication in the nature of the circuit designs themselves has only exacerbated the situation, with the number and interdependencies of applicable parameters (such as track length, track separation, the associated crosstalk) growing ever more complex. Such is the complexity in many cases that selectively modifying a constraint instance may have considerable unintended effect upon various other constraint instances. It is a daunting challenge even for the most experienced and skilled of circuit designers, and even in applications involving circuit designs of marginal complexity, to manually monitor such unintended effects in full scope. Suitable post-routing optimization of an interconnect solution thus remains far from attainable in many cases today.

In many applications, the certain select constraints are of particular importance to the circuit design than others. The capability to selectively over-constrain that and, possibly, other constraint instances, in a recursive manner would be invaluable to the PCB designer seeking the best possible interconnect solution. Presently, there is no automated means known to reliably evaluate the full potential impact upon the circuit design and its interconnect solution of over-constraining a particular constraint instance. Nor is there a reliable means known by which to automatically assess whether a selective modification to the interconnect solution would in fact improve its overall degree of compliance with applicable constraints.

The only viable alternative heretofore known for reliably assessing the impact of over-constraining a given circuit design is to re-execute the autorouting in its entirety with the circuit design over-constrained in anticipatory manner. There is therefore a need for comprehensive automatic optimization of an autorouted interconnect solution. There is a need for a method and system by which such post-routing optimization of a circuit design is made without adverse impact upon compliance with any applicable constraint.

2. Prior Art

Autorouter systems having post-routing capability for limited manipulation of certain pre-set features are known. These include systems which effect routing passes for reducing the number of resultant via structures. They also include systems which execute track-centering by which a route disposed between two terminals is automatically re-positioned to the half-way point between them, for higher PCB yield.

Although such known systems incorporate apparent improvements as to certain types of constraints, they full to do so in a manner which guards against potential adverse impact of the apparent improvement upon other constraints. They fail, therefore, to provide any balancing of the possible inter-dependencies between different constraints. A track-centering change of the type known, for example, could potentially increase crosstalk on a neighboring circuit layer to the point of non-compliance. Likewise, a via-reduction change of the type known could potentially increase track length beyond the corresponding constraint limit.

There is no method or system known which automatically monitors for and guards against such potentially adverse effects of an optimizing change to the interconnect solution. Nor is there any method or system known which does so in a comprehensive and user-selective manner to ensure that an optimizing change does actually improve upon the interconnect solution's overall the degree of compliance with applicable constraints.

SUMMARY OF THE INVENTION

It is an object of the present invention to provide a method and system for automatically optimizing an autorouted interconnect solution in a manner that guards against adverse impact upon adherence to circuit design requirements.

It is another object of the present invention to provide a method and system by which carries out post-routing optimization of an interconnect solution without adversely affecting its degree of compliance with all applicable constraints.

It is yet another object of the present invention to provide a method and system for selectively over-constraining a constraint instance of a circuit design and automatically monitoring the resulting effect upon all other constraint instances interdependent thereto.

It is still another object of the present invention to provide a method and system which over-constrains a constraint instance automatically responsive to measurable improvement in overall compliance with applicable constraints to be derived therefrom.

These and other objects are attained in a method and system realized in accordance with the present invention for selectively optimizing a circuit design for physical implementation. The method and system include generating a circuit routing solution in accordance with a plurality of constraints for parametric resources of the circuit design, with the constraints being defined respectively by a plurality of corresponding constraint instances. Each constraint instance variably indicates an effective constraining limit and degree of consumption for at least one of the parametric resources. At least one of the constraints is selectively adjusted by a predetermined over-constraining amount, and the circuit routing solution is preliminarily modified by applying at least one routing action selected responsive to the constraint adjustment. An automatic evaluation is then made of the potential impact upon constraint compliance. The evaluation includes generating a relative cost measure for the preliminary modification of the circuit routing solution, based at least partially upon each of the constraint instances. Thereafter, the preliminary modification of said circuit routing solution is either discarded or accepted responsive to the evaluation. A number of these operations may be repeated in recursive manner, if appropriate for the given application.

DESCRIPTION OF THE PREFERRED EMBODIMENTS

Certain beneficial features of the present invention are best understood in view of the following definitions of certain terms as used herein. The definitions are not exclusive of other customary definitions for the terms which may be accorded thereto, where so indicated either expressly or implicitly.

As used herein, the term "design" refers to an Electronic Design Automation (EDA) database of information describing such things as a Printed Circuit Board (PCB), an Integrated Circuit (IC), an IC Package, or a System-in-Package (SiP). A system may include a set of such designs.

As used herein, a "terminal" is a location on one or more layers of a circuit design on which electrical signals may be present. On a PCB, terminals include such structures as "pins," "pads," "solder balls," and the like. In an IC Package or SiP design, terminals typically include such structures as "IC bumps" or "Package balls." Additionally, a terminal may include in other contexts such structures as a junction point, alternatively referred to as a "virtual pin," "ratT," or "T-junction." Typically, multiple terminals are grouped together in a single "component."

Figure 1:
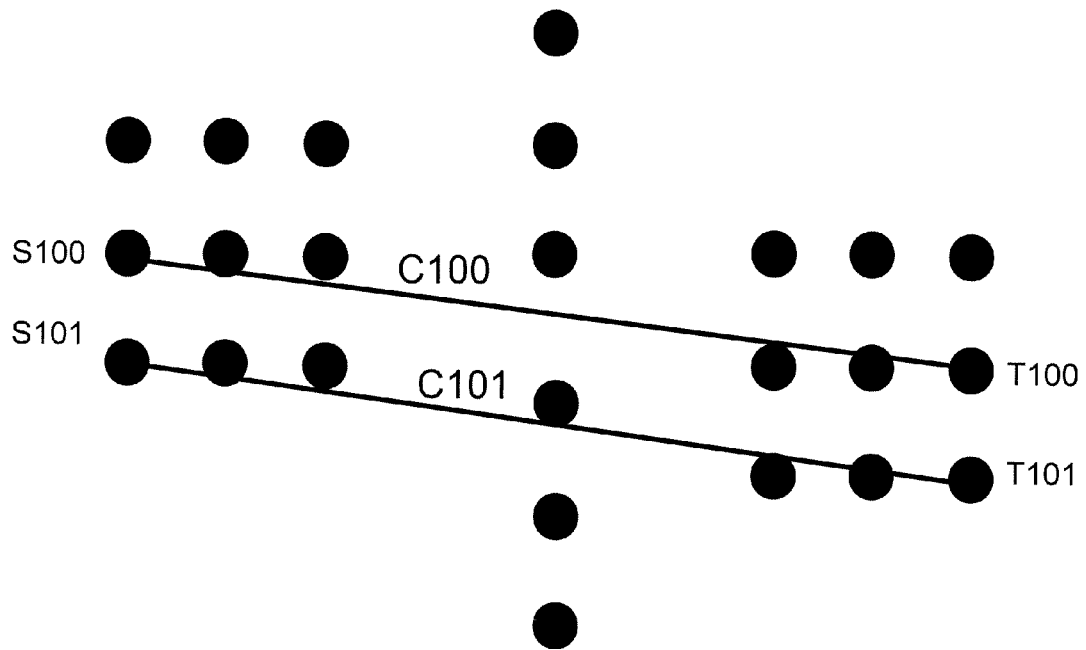
FIG. 1 is an explanatory diagram illustrating examples of connections between respective source and target terminals.

A "connection" (C100, C101) of a circuit design, as shown in FIG. 1, is identified by a pair of terminals requiring electrical interconnection. Moreover, a connection may be configured, for example, as a "rat," "pin pair," "fly line," "rubber band," or the like. The paired terminals of a connection respectively constitute a "source terminal" (S100, S101) and a "target terminal" (T100, T101).

Figure 2:
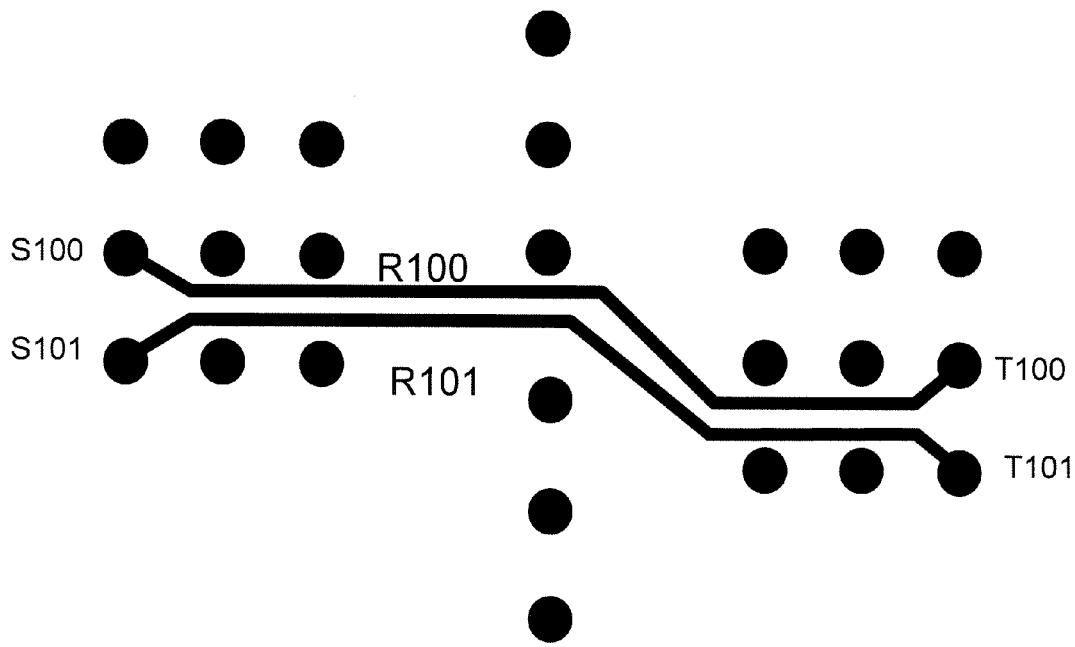
FIG. 2 is an explanatory diagram illustrating examples of routes between the respective source and target terminals illustrated in FIG. 1.

A "route" (R100, R101), as illustrated in FIG. 2, refers to a particular path implementing a connection. Furthermore, each route has associated therewith complete geometric information specifying an ordered sequence of segments starting at the source terminal and ending at the target terminal.

A "net" refers to a collection of terminals that must be electrically connected. In some cases, the specific electrical connections are predefined, while in others, the connections are constrained by design rules and automatically connected via an automatic routing engine. In the absence of applicable design rules, an automatic routing engine may change connections as needed, provided that the altered connections do actually connect the entire collection of terminals.

A "type of constraint" refers a design rule that may be applied to certain portions of a design. For example, a "maximum length constraint" is a type of constraint in that it may be applied to either a net or a connection (to limit the lengths of the segments implementing its routes).

A "distance-based constraint" refers to a constraint which is specified in terms of a distance parameter. Examples include minimum and maximum length constraints, track width constraint, and clearance/separation constraint between adjacent objects.

A "timing-based constraint" refers to a constraint which is measured in terms of a time parameter. Examples include minimum and maximum delay constraints. Where certain information like layer information and signal propagation speed, for instance, are known, a timing-based constraint may normally be converted to a distance-based constraint if necessary.

A "voltage-based constraint" refers to a constraint which is specified in terms of a voltage parameter. One example is a maximum crosstalk constraint. Where certain information like layer thickness and layer material composition, for instance, are known, a voltage-based constraint may normally be converted to a distance-based constraint for certain frequency ranges if necessary (using, for example, a 3-dimensional field solver).

A "count-based constraint" refers to a constraint which is specified in terms of an integral count parameter. Examples include a maximum number of vias constraint and a maximum number of layers constraint.

A "resource-based constraint" refers to any constraint which may be measured numerically. Distance-based constraints, delay-based constraints, voltage-based constraints, and count-based constraints are all examples of such. Resource-based constraints are distinguishable from various other known types of constraints like restricted via type constraints which, for example, require the use of a particular type of via pad stack in a net. Unlike resource-based constraints, these constraint cannot be improved upon once they are met (using the required via pad stack type). Thus, it is preferably just resource-based constraints which are considered for optimization in accordance with the present invention, as optimization of numerically immeasurable constraints is usually quite impracticable.

An "interconnect solution," refers to a set of conductive routes for physically implementing all connections in satisfaction of all applicable constraints. An interconnect solution may be found automatically utilizing an automatic routing engine or manually using an interactive routing tool.

Constraint Instance

A constraint instance refers to a particular type of constraint applied to a particular parameter of a design. While other design rules may be preset for general applicability to the given circuit design without further user input or definition, a constraint instance in the illustrative embodiment disclosed herein represents a specific expression of a design rule for which one or more parametric values may be user-defined for the intended application. An example of a constraint instance is a design rule limiting the maximum length for a particular net to 3.0 inches, or other numeric limit. Note that a particular design parameter is not necessarily limited to a single constraint instance and may in certain cases be subject to one or more other constraint instances, yielding interdependencies between such constraint instances.

In accordance with an exemplary embodiment of the present invention, each constraint instance is preferably defined to include certain elements as follows:

| Constraint Instance | | |
| --- | --- | --- |
| Element | Value Type | Associated State Indication |
| Resource Limit | Numeric (quantity) | Violated/Not violated |
| Resource Status | Numeric (quantity) | Compliant/Non-compliant |
| Compliance Level | Numeric (proportional) | Over-constrained/ Under-constrained |
| Goal Level | Numeric (proportional) | Goal met/Goal unmet |
| Compliance Function | Boolean | True/False |
| Cost Function | Numeric (quantity) | Reduced/Not reduced |

A resource limit of a constraint instance includes a predetermined quantitative value that the given design parameter is prescribed to remain within. For example, a particular net ABC may be subjected to a design rule limiting the sum of the lengths of all its route segment to be 4.0 inches or less, by the constraint instance "max total etch length" having its resource limit pre-set at 4.0.

A resource status of a constraint instance includes a predetermined quantitative value indicating the amount of the constraint's resource currently being exhausted. In the above example, if the sum of the route segment lengths as currently routed for the net totals 3.5 inches, then the resource status is 3.5.

While constraint instances are defined with appropriate units (length, time, voltage etc.) associated therewith, resource limit and resource status values themselves are preferably defined and stored as unit-less numeric values.

It is to be understood that while the resource limits for constraint instances are in the specific examples described herein expressed as maximum limits, they may be expressed otherwise in accordance with the particular requirements of the intended application—as minimum limits, for example. Moreover, resource limit and status values may be expressed accordingly as positive or negative values, depending on the particularities of the intended application. The resource limit and status values are preferably expressed, for simplicity, as either maximum or minimum values. A tolerance constraint, for instance, may be expressed as a maximum allowed difference between the highest peak point and the lowest valley point for a parameter, rather than as a permitted range defined by upper and lower boundary values.

Figure 3:
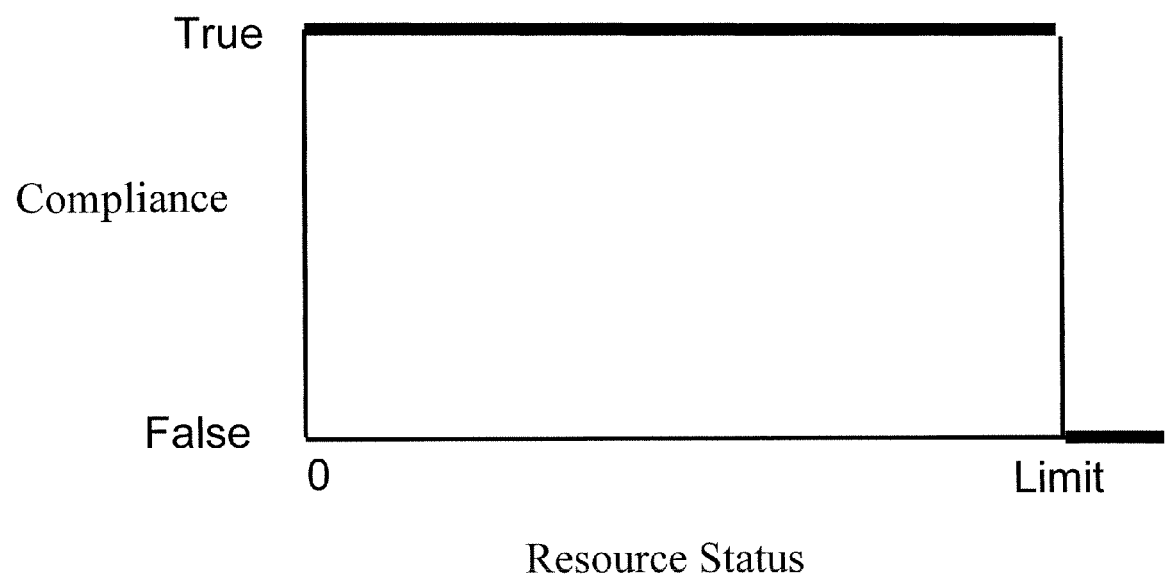
FIG. 3 is a diagram graphically illustrating an example of a compliance function employed in accordance with certain embodiments of the present invention, shown for a compliance level set at unity value.

Each constraint instance includes a compliance function associated therewith. The compliance function characterizes a Boolean metric, indicating "True" or "False" depending on whether the resource status of the constraint instance is at a compliant or non-compliant level. In accordance with an exemplary embodiment of the present invention, the compliance function is preferably represented as a step function such as illustrated in FIG. 3, which remains high (True) where the resource status is at a compliant value in view of the compliance level, and low (False) where the resource status is at a non-compliant value in view of the compliance level.

Figure 4:
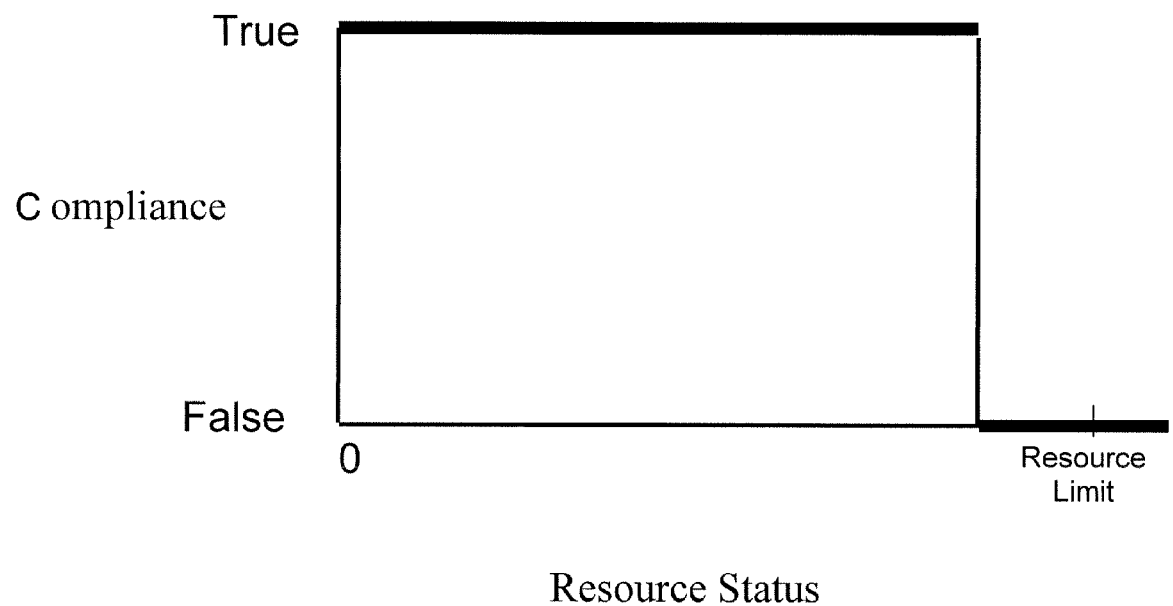
FIG. 4 is a diagram graphically illustrating the compliance function of FIG. 3, shown for a compliance level set at a value greater than unity.

A compliance level is preferably a relative proportional value, such as a percentage, for varying a threshold for determining whether or not the resource status value is compliant or non-compliant. While it may be suitably defined otherwise in alternate embodiments, the compliance level is preferably defined in the illustrative embodiment described herein to be a percentage of the resource status to be compared with the resource limit in determining compliance/non-compliance according to the compliance function. A compliance level of 100% simply sets the threshold for this compliance/non-compliance determination squarely at the resource limit. A compliance level of greater than 100% shifts the threshold downward to a value less than the resource limit (FIG. 4), to reduce the range of resource status values which would be compliant. A compliance level of less than 100% shifts the threshold upward to a value greater than the resource limit, to expand the range of resource status values which would be compliant. Thus, a constraint instance is said to be "over-constrained" if its current compliance level is set at a value greater than 100%, while it is said to be "under-constrained" if its compliance level is set at a value less than 100%. The constraint instance is said to be altogether unconstrained if its current compliance level is set at a value of 0%.

A constraint instance is said to be "compliant" if its resource status multiplied by its compliance level is less than or equal to its resource limit. As an illustrative example, where a constraint instance is defined with a compliance level of 100%, resource limit of 5.0, and resource status of 4.6, the constraint instance would be compliant. In addition, it would not be in "violation" of the resource limit because the resource status (whether with or without the compliance level multiplier) does not exceed the resource limit. That is:

Resource status*Compliance level<Resource limit; or, 4.6*1.0=4.6, and 4.6<5.0.

If for the same constraint instance were defined with a compliance level of 110%, and the resource status value remained 4.6, the constraint instance would be non-compliant, although it would still not be in "violation" of the resource limit. The resource status multiplied by the compliance level would in fact exceed the resource limit, though it still would not by itself exceed the resource limit. That is:

Resource status*Compliance level>Resource limit; or, 4.6*1.1=5.06, and 5.06>5.0.

A constraint instance is said to be in "violation" if and only if its resource status value exceeds its predetermined resource limit value. As noted in the preceding example, a constraint instance may be in violation yet still be compliant, where its compliance level is set to relax, or under-constrain, or otherwise leave alone the constraint instance (at a compliance level less than or equal to 100%). Conversely, a constraint instance may not be in violation yet be non-compliant, where its compliance level is set to tighten, or over-constrain, the constraint instance (compliance level greater than 100%).

A goal level is similar to a compliance level. Like the compliance level, it is preferably expressed as a relative proportional value, such as a percentage, for varying a threshold by which to determine whether or not the resource status value would be compliant or non-compliant. The goal level is preferably defined to correspond in form (though not in actual value) with the compliance level. In the disclosed embodiment, therefore, it is expressed as a percentage of the resource status to be compared with the resource limit in determining compliance/non-compliance according to the compliance function. The goal level preferably represents a target setting for the compliance level, should it be acceptable, so that the constraint instance may be tightened, or more-constrained relative to the current compliance level (where the compliance level is presently at an under-constrained level—less than 100%—heightening the constraint may still leave the goal level at an under-constrained level, though it would be 'more constrained'). More generally, the goal level represents a desired proportional value for either under-constraining or over-constraining a constraint instance.

A constraint instance is said to "meet its goal" if its resource status multiplied by its goal level is less than or equal to its resource limit. As an illustrative example, where a constraint instance is defined with a compliance level of 105%, a resource status of 6.6, a resource limit of 7.0, and a goal level of 110%, the constraint instance would be compliant. Furthermore, it would not be in violation of the resource limit because the resource status of 6.6 does not exceed the resource limit of 7.0. The goal level would not be met for the constraint instance, however, because the resource status, when multiplied by the goal level, exceeds the resource limit. That is:

Resource status*Compliance level<Resource limit; or, 6.6*1.05=6.93, and 6.93<7.0; but, Resource status*Goal level<Resource limit; or, 6.6*1.10=7.26, and 7.26>7.0.

One or more predefined cost functions are employed in accordance with the present invention to provide a cost metric by which to determine whether or not modifications in compliance level would in fact improve the overall degree of compliance with applicable constraints. This provides a measurable indication for choosing the "better" of two or more possible interconnect solutions for a design. Precisely what constitutes "better" may be defined in any suitable manner consistent with the requirements of the intended application. In the illustrative embodiment disclosed, a cost function is preferably defined such that the lesser the cost factor generated thereby, the "better" it is. In alternate embodiments, the cost function may be otherwise defined such that the greater the cost factor generated thereby, the "better" it is.

Cost functions which may be employed in accordance with the present invention are each preferably selected and/or defined as a function of a constraint instance's current resource status, in view of its current goal level and its resource limit. Preferably, the characteristic cost factor vs. resource status curve defining the particular cost function to be applied will differ for different goal level values. The cost function in any event generates a numeric cost factor, preferably returning a cost factor whose value varies with the resource status value, and with the goal level then in effect for a given constraint instance.

In the embodiment illustrated, where the constraint instance's resource status is less than the resource limit, the cost factor tends to be a lesser value, while it tends to be a greater value where the resource status exceeds its resource limit. Where the constraint instance manages to meet its goal level, the cost factor tends to be a lesser value, while it tends to be a greater value where the constraint instance fails to meet its goal level.

Preferably, the cost function is executed and cost factor generated for each constraint instance. A constraint instance's cost factor is considered, for instance, in determining whether or not an autorouting action contemplated for optimization purposes would in fact have a beneficial effect upon that constraint instance (reduce cost). As a starting point, the cost functions for all constraint instances are computed preferably with compliance and goal level values both initially set at 100%. This establishes a cost factor baseline against which subsequently computed cost factors for the constraint instances may be compared to discern changes in the degree of compliance.

A total system cost factor is computed as the sum across the entire system comprising, for example, one or more PCB boards, IC packages, and/or ICs. This may be a simple numeric sum, or a selectively weighted sum which emphasizes the cost factor contribution of certain constraint instances over others. An example may be where crosstalk were of greater concern to the circuit designer than delay. In that case, the cost factor for the crosstalk constraint instance would be weighted by a value greater than 1.0 when combined with the cost factors of other constraint instances.

Figure 5:
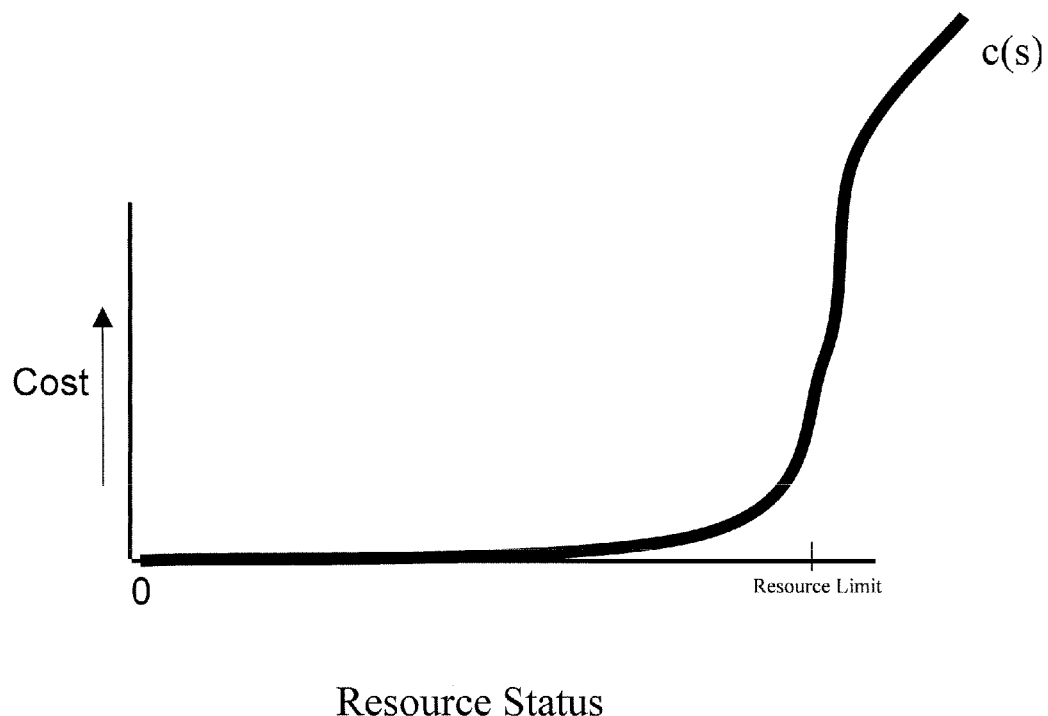
FIG. 5 is a diagram graphically illustrating an example of a cost function employed in accordance with certain embodiments of the present invention, shown for a compliance level set at unity value.

FIG. 5 graphically illustrates one example of a cost function which may be employed in accordance with the present invention. This illustrative cost function is graphically defined by a cost/status curve as shown, at a corresponding goal level of 100%. The cost/status curve will preferably differ in some predetermined manner for a goal level other than the 100% shown. The curve reflects lower cost factor values when the constraint instance's resource status is less than the resource limit, increasing at progressively greater rate as the resource status approaches then exceeds the resource limit.

Figure 6:
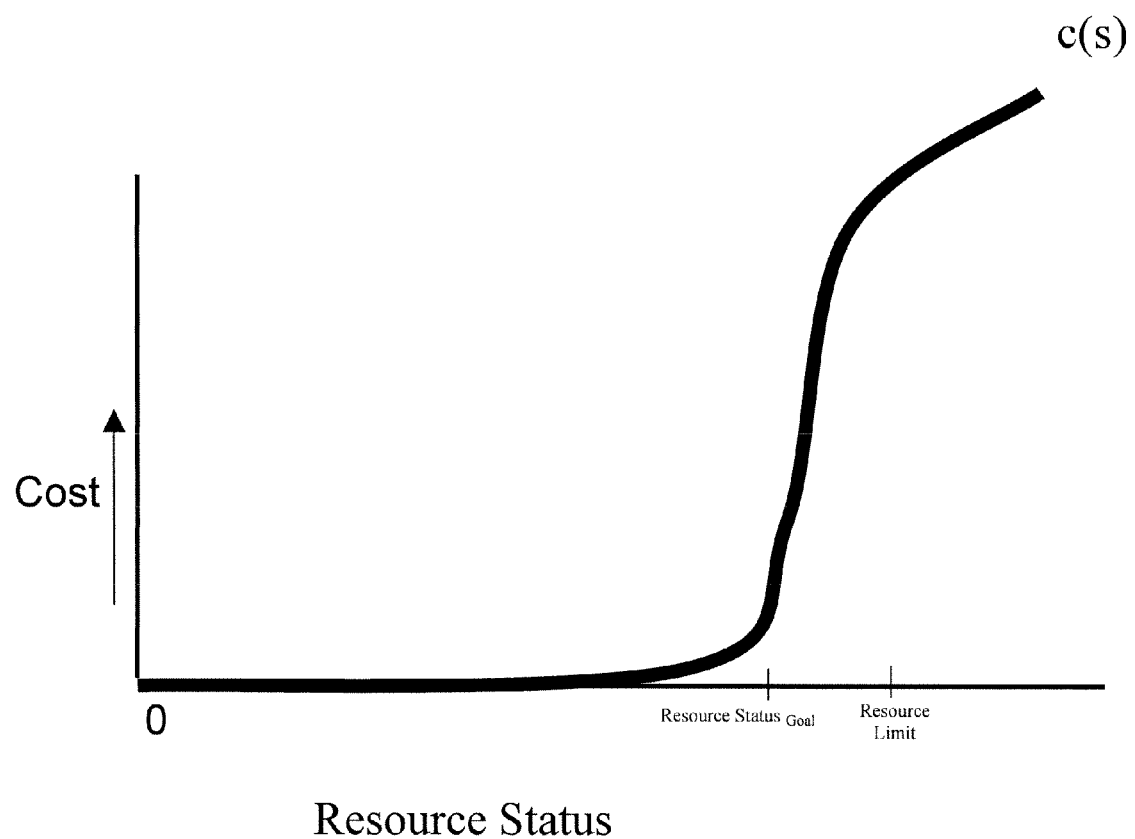
FIG. 6 is a diagram graphically illustrating the cost function of FIG. 5, shown for a compliance level set at a value greater than unity.

FIG. 6 graphically illustrates a similar cost function for an over-constrained constraint instance (with the goal level above 100%). Again, the cost/status curve reflects lower cost factor values when the constraint instance's resource status is less than the resource limit, but begins to increase at a progressively greater before the resource status approaches the resource limit. The curve increases at the progressively greater rate as the resource status approaches then exceeds the point at which the resource status would meet the goal level. That is, the curve begins to increase dramatically where the resource status would no longer meet the goal level.

Figure 7:
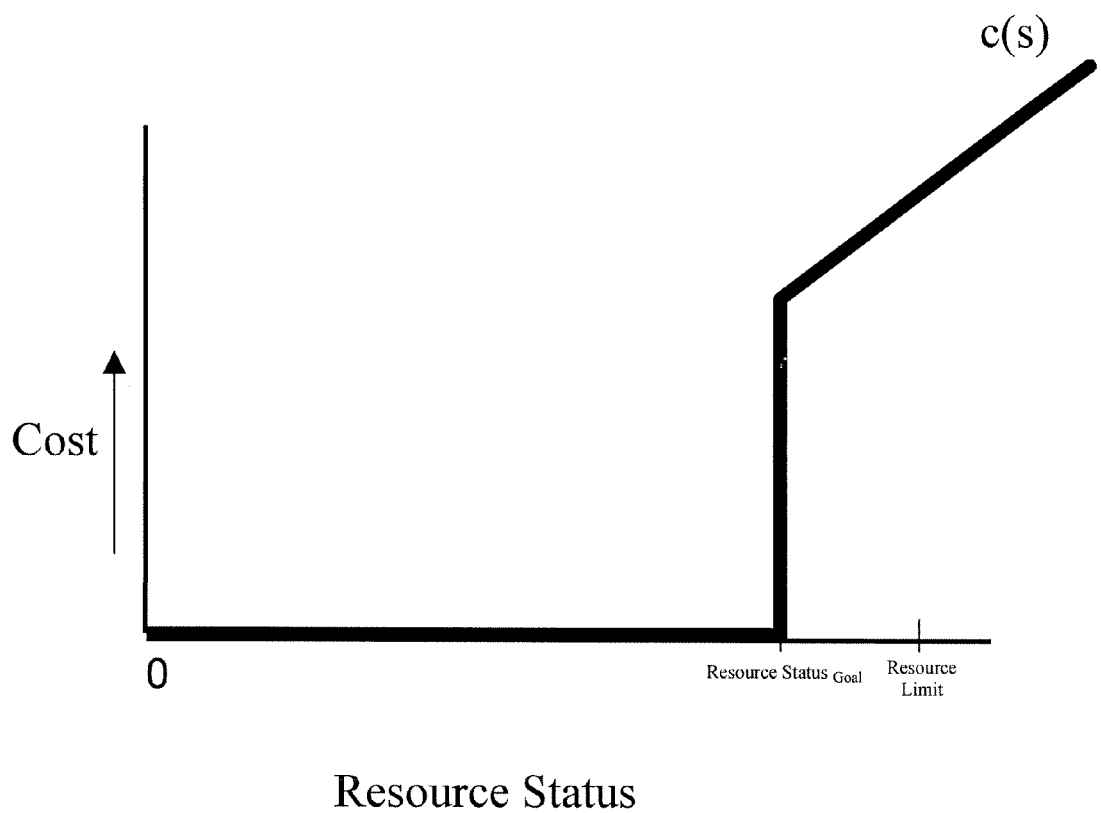
FIG. 7 is a diagram graphically illustrating an example of a stepped linear cost function employed in accordance with certain other embodiments of the present invention, shown for a compliance level set at a value greater than unity.

The cost function is preferably characterized, however, so that it returns a markedly greater value as the resource status approaches and exceeds the applicable limit (be it simply the resource limit, or that resource status value which when multiplied by the goal level exceeds the resource limit). A linear cost function is illustratively profiled for an over-constrained condition in FIG. 7, defined generally by the equation:

$$c(s) \equiv \begin{cases} 0, & \text{if } s < \text{floor} \\ s*a + b, & \text{if } s \geq \text{floor} \end{cases}$$

where "s" represents the resource status value, and "a", "b", and "floor" represent constants selected in view of the goal level and resource limit.

Figure 8:
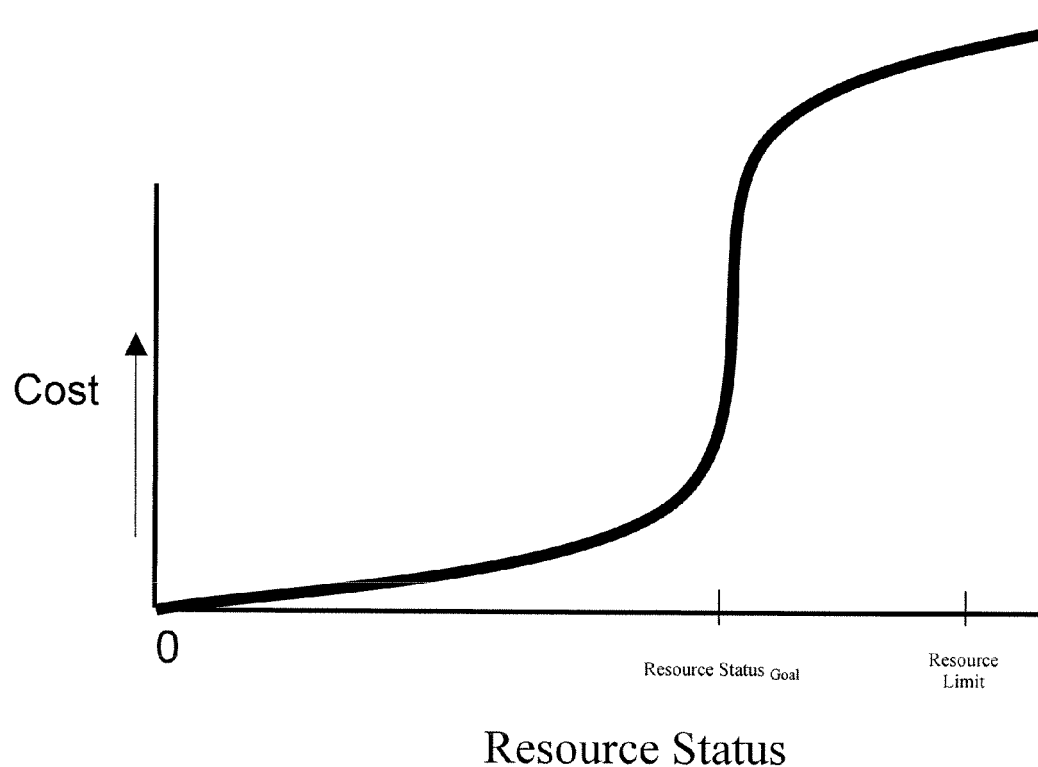
FIG. 8 is a diagram graphically illustrating an example of a sigmoid cost function employed in accordance with certain other embodiments of the present invention, shown for a compliance level set at a value greater than unity.

An s-curve cost function, specifically embodied as a Sigmoid function, is illustratively profiled for an over-constrained condition in FIG. 8, defined generally by the equation:

$$c(s) = \frac{1}{1 + e^{-s}}$$

where "s" represents the resource status value.

These are but a few examples of cost functions potentially used in accordance with the present invention, which is not limited to any particular choice of such.

Exemplary Embodiment

Figure 9:
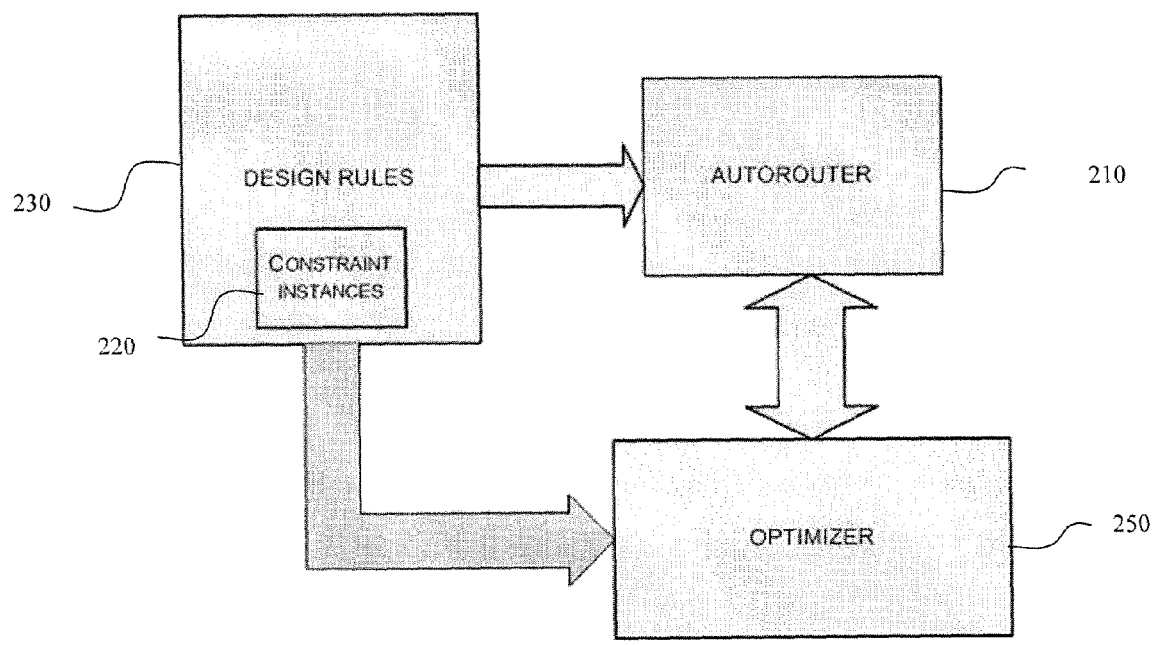
FIG. 9 is a schematic diagram generally representing an example of a system formed in accordance with certain embodiments of the present invention.

Referring now to FIG. 9, there is schematically represented a system 200 formed in accordance with one exemplary embodiment of the present invention. System 200 generally includes an autorouter 210, which may be of any type known in the art suitably equipped and configured for the intended application. Autorouter 210 operates in accordance with a plurality of design rules 220 effectively constraining the circuit design to be implemented on the PCB. These design rules 220 include a plurality of user-definable constraint instances 230, examples of which encompass distance-based constraints, timing-based constraints, voltage-based constraints, count-based constraints, and other resource-based constraints, as discussed in preceding paragraphs. Each constraint instance 230 preferably specifies an effective parametric limit bearing on the circuit design's routing.

System 200 further includes an optimizer 250 coupled to the autorouter 210 which in accordance with one aspect of the present invention serves to recursively optimize a routing solution generated by the autorouter 210. Optimizer 250 carries out such optimization automatically in light of the design rules 220 and constraint instances 230 imposed on the given circuit design. As described in following paragraphs, optimizer 250 operates to modify certain constraint instances and prompt appropriate routing actions by the autorouter 210 as necessary, but only upon automatically verifying that such modification will have no adverse impact on the interconnect solution's overall compliance with the constraints imposed thereon. Optimizer 250 eventually generates an optimized interconnect solution for implementation of the given circuit design.

It is to be understood that while optimizer 250 is for illustrative purposes schematically represented separate and apart from the autorouter 210, one skilled in the art will readily recognize that this does not necessitate implementation of such as a unit physically separate and apart from the autorouter 210. Optimizer 230 may be implemented in any suitable manner known in the art. For example, optimizer 230 may be programmably integrated into suitable portion(s) of the autorouter 210 itself.

In overall concept, optimizer 230 provides for certain constraint instances to be over-constrained, if it is automatically determined that doing so will not cause adverse effect upon the given interconnect solution's overall compliance with the design constraints at hand, but will instead yield measurable improvement in overall compliance. Optimizer 230 preferably permits one or more constraint instances to be selected by the user for such over-constraining, automatically carrying out in support the evaluations necessary to assess both the acceptability and desirability of so over-constraining the constraint instance(s). In this manner, optimizer 230 effectively makes for the autorouting process comprehensively validated trade-off decisions between different, often competing, constraints which were heretofore left only to the human designer to even attempt. It provides optimized interconnect solutions reflecting constraint instances that are over-constrained to the extent reasonably possible without causing non-compliance of another as a result.

Toward that end, a constraint instance such as described in preceding paragraphs, is preferably evaluated in terms of its present compliance level, as well as in terms of its goal level (essentially, the new compliance level presently contemplated). This evaluation, moreover, takes into account the attendant compliance levels and goal levels (which may or may not be different from the corresponding compliance levels) of all other constraint instances. Only where a particular constraint instance's goal level is met to an acceptable degree (reduction in cost factor and/or total system cost factor), and none of the compliance levels—including its own—is violated as a result, are any route optimizing actions necessitated by the current goal level actually adopted. Where the optimizing actions are adopted, any goal level of a constraint instance different from its current compliance level is adopted as the new compliance level.

This process may be repeated recursively with a raised goal level for further over-constraining either the same or a different constraint instance. Ultimately, the end result of such optimization would be increases in compliance level for some if not all constraint instances, without requisite reduction in compliance level for any constraint instance.

Main Loop

Figure 10:
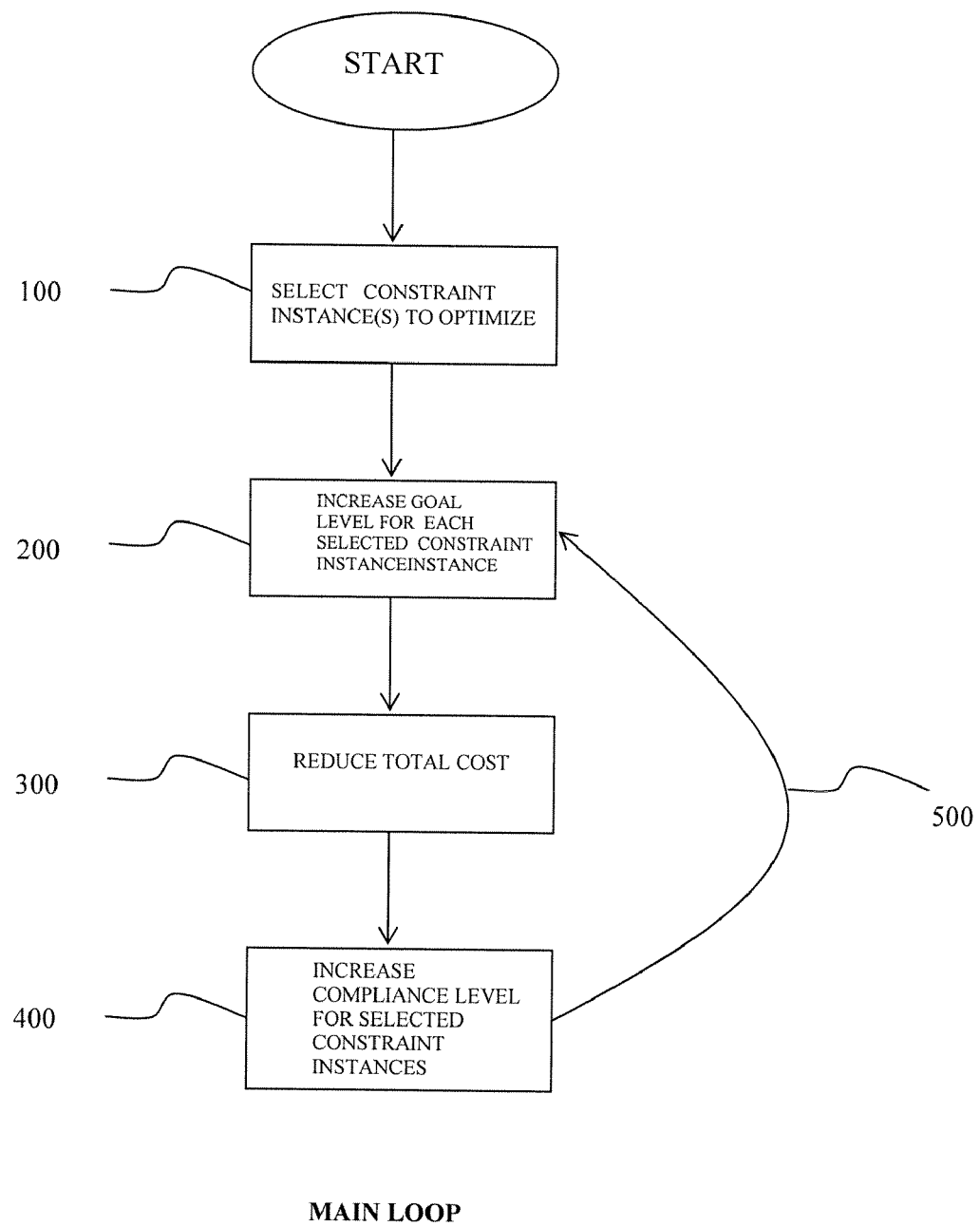
FIG. 10 is a flow diagram illustrating an exemplary flow of processing in a main operational loop established in accordance with one embodiment of the present invention; and, FIG. 11 is a flow diagram illustrating an exemplary flow of processing in a cost reduction operational loop established in the embodiment of the present invention illustrated in FIG. 10.

Turning now to FIG. 10, there is shown a flow diagram generally illustrating a sequence of operations carried out by optimizer 250 in accordance with one exemplary embodiment of the present invention. The operations carried out may be suitably implemented by any appropriate means known in the art. Preferably, the operations are carried out in a processor-based device programmably configured for appropriate execution and operably coupled to the autorouter 210.

The optimizing operations are carried out preferably after a fully compliant interconnect solution is initially obtained. In the present embodiment, this initial interconnect solution may be generated automatically by execution of the autorouter 210. In other embodiments, it may be alternatively obtained more manually using an interactive routing tool of any suitable type known in the art. In still other embodiments, a combination of automatic and manual routing means may be used to obtain the initial interconnect solution. The initial interconnect solution assures that all constraint instances are initially compliant, or in satisfaction of their user-specified compliance levels. The initial goal levels for all the constraint instances are preferably set to equal the compliance levels at this point.

According to an exemplary embodiment of the present invention as illustrated, one or more constraint instances for a particular design item are selected at block 100 to be modified. This selection may include either a single constraint instance or a group of constraint instances associated with one or more particular design parameters. In perhaps the simplest case, all constraint instances for the circuit design may be selected, though this may prove prohibitively inefficient in many cases. In most cases, however, certain constraint types or even certain individual constraint instances are readily identified by the circuit designer to be of particular importance for the intended application. These constraint types/constraint instances are selected as the first to be optimized.

Any suitable criteria may be employed for selecting such constraint instances, or the order in which they are selected for optimization. For example, the circuit designer may designate a particular class of critical nets to be first over-constrained, after which other classes of critical nets are sequentially over-constrained until all nets have been over-constrained for optimization, whereafter the process is repeated, beginning again with the first class. As another example, the circuit designer may order various types of constraints to be sequentially over-constrained for optimization. All crosstalk constraints may first be over-constrained, for instance, followed by all maximum length constraints, then all match length constraints, and so on until the delineated constraint types are exhausted, whereafter the process is repeated, beginning again with the crosstalk constraints. These are but a few of the numerous selection criteria which may be employed, and the present invention is not limited to any particular choice of selection criteria.

The flow proceeds next to block 200, where the goal level of each constraint instance selected at block 100 is raised by a predetermined amount in order to over-constrain that constraint instance. The raised goal level represents the new value that the constraint instance's compliance level would be set to—if its beneficial effect on the overall degree of compliance, as reflected by the resulting total system cost factor, can be validated by subsequent automatic evaluation.

Any suitable approach may be taken in raising the goal level. The adjustment amount may simply be pre-defined. Alternatively, the adjustment amount may be varied iteratively, depending upon the results of each prior adjustment. For instance, the goal level may be set to 105% for the first iterative attempt at optimizing a constraint instance. If successful on the first attempt, the goal level may be incrementally increased to, say, 110% for the next iterative attempt. If unsuccessful on the first attempt, the goal level may otherwise be decreased to, say, 102% for the next attempt.

Another alternate approach may provide for the goal levels to be controlled more directly by the user. The goal levels may be specified to a set level, for example, when the constraint instances are selected for optimization at block 100.

Once the goal level has been set (or re-set), the flow proceeds to block 300, where the effect of the attempted optimization is comprehensively evaluated. The potential violation of any design rule and noncompliance of any constraint instance due to the attempted optimization are checked for at block 300, in accordance with a preferred embodiment of the present invention. In the event that no such potential design rule violations or constraint instance noncompliance would occur as a result of the attempted optimization, a further check is made to determine if the total system cost factor is reduced by the optimization. If so, the optimization attempt is deemed successful, and the attendant modifications/adjustments accepted. If not, the optimization attempt is deemed unsuccessful, and the pending modifications/adjustments discarded.

An attempt is made in this regard at block 300 not only to avoid possible adverse impact upon the interconnect solution, but also to ensure that the contemplated optimization action does in fact improve the interconnect solution's functional merit (its quality, or "goodness"). Any potential adverse impact is accordingly identified and promptly remedied, if possible. Even then, the optimization action is taken only where the improvement in functional merit is measurably confirmed. In accordance with a preferred embodiment of the present invention, block 300 includes a cost reduction loop 3000 (FIG. 11), as described in following paragraphs, to carry out this assessment/validation process.

If the contemplated optimization is successful at block 300, the compliance levels for the selected constraint instances are appropriately updated at block 400, preferably to match their successful goal levels if possible. The approach here is to 'lock in' at least the gains made by the successful optimization attempt just carried out. A less conservative approach may be to raise the compliance level to the highest permissible extent possible for each constraint instance in question, without rendering it non-compliant. Expressed mathematically, the compliance level may be raised in that case to the percentage corresponding to the value: (resource limit)/(resource status), with necessary safeguards to avoid division by zero.

The more conservative, and preferred, approach of limiting the updated compliance level to no more than the current goal level safely 'locks in' no more gain than was validated during the successful optimization. In mathematical terms, the compliance level is set to the greater of current goal level and the percentage corresponding to the value: (resource limit)/(resource status), again with necessary safeguards to avoid division by zero. Other suitable approaches may be taken for updating compliance levels at block 400, depending on the particular requirements of the intended application.

In accordance with the present invention, therefore, a user attempting to modify or adjust certain constraints associated with a circuit design is relieved the computational nightmare of having to manually balance the numerous interdependencies between different constraints. The method and system described herein automatically tests any contemplated action to over-constrain a parameter before incorporating them into the circuit design. The tests ensure that the contemplated action it will not throw any other constraint instance out of compliance, cause any design rule errors, or increase an overall cost measure for the circuit design.

Cost Reduction Loop

Figure 11:
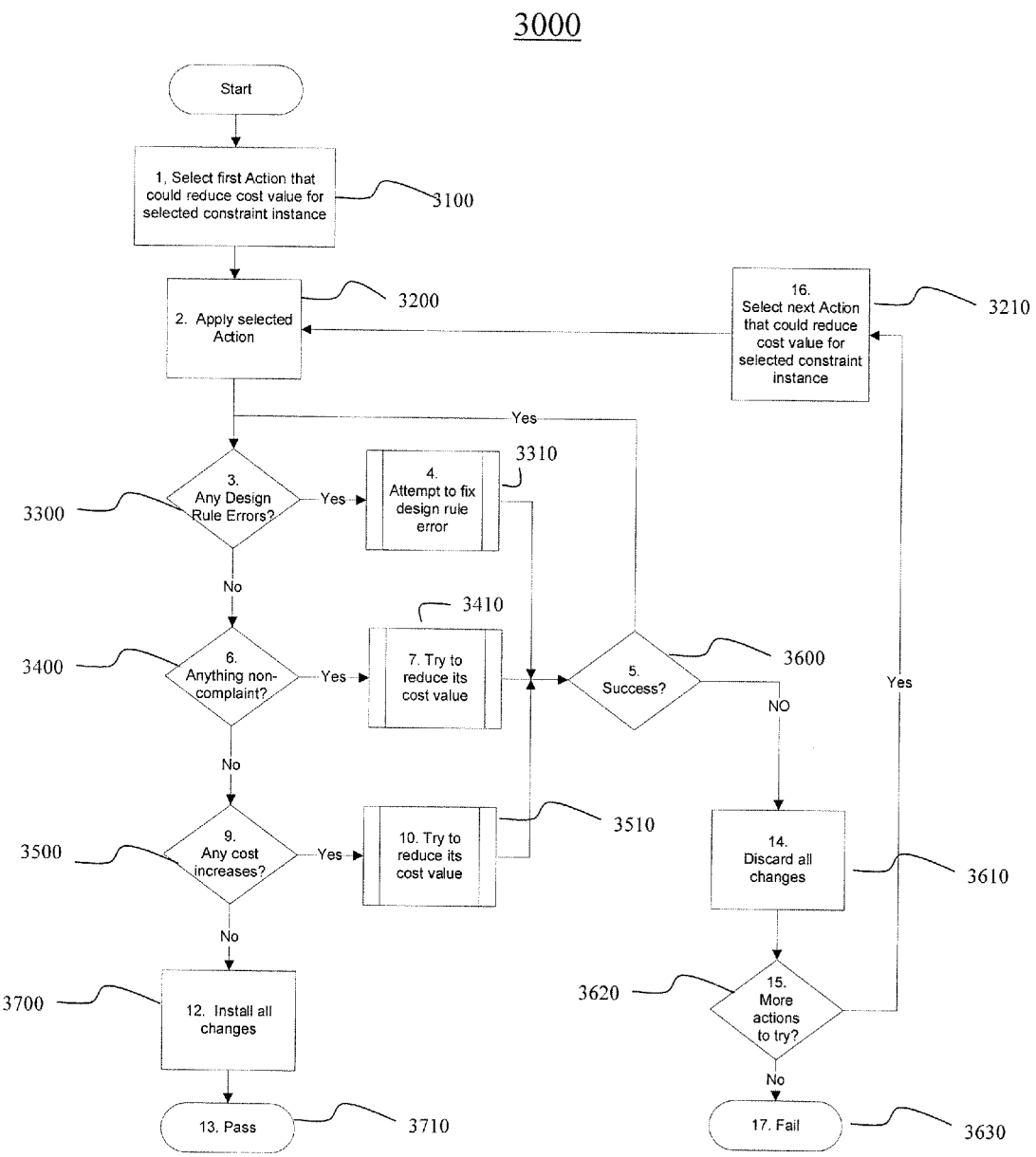

Turning next to FIG. 11, there is shown a flow diagram generally illustrating a sequence of operations preferably carried out in one exemplary embodiment of a cost reduction loop 3000. It is preferably the cost reduction loop 3000 which carries out much of the computational and analytic processing to determine whether or not a constraint instance optimization attempt would be successful despite its collateral effects due to parametric interdependencies. The cost reduction loop 3000 executes a series of sequential and recursively executable operations to preserve constraint compliance and reduce the overall system cost factor.

As illustrated in FIG. 11, an action is selected at block 3100 as a possible action by which to reduce the cost factor for a constraint instance selected at block 200 of the main operational loop (FIG. 10). Preferably, the action is one which the autorouter may be actuated to carry out. The action would incorporate in the interconnect solution parametric change(s) necessitated by the constraint instance's goal level.

The nature of the possible actions is preferably dependent upon the type of constraint in question. For example, if the type of constraint were a minimum length constraint for a connection, a possible action may include an elongation action which inserts additional segments in the connection-implementing route to extend its length. Other possible actions may include re-establishing an altogether new route which defines a meander path to extend the path distance between the source and target.

If the constraint type were maximum crosstalk, one possible action may include increasing the clearance distance between identified aggressor and victim nets. Other possible actions may include re-establishing an altogether new route for the victim net which avoids close proximity with the aggressor net(s).

If the constraint type were maximum number of vias, one possible action may include relocating a segment to another layer to eliminate the need for a vias. Another possible action may include re-establishing an altogether new route which requires fewer, if any, vias.

For each selected constraint instance, at least one action having the possibility to reduce the cost factor must be available to the autorouter. Otherwise, another selected constraint instance must be taken up for possible cost-reducing action.

At block 3200, the selected action is appropriately applied by the autorouter to the interconnect solution. A search is then made at block 3300 for any design rule errors due to the applied action. An autorouter is typically equipped with at least certain standard design rule violation resolution measures; and, such measures are suitably invoked as necessary at block 3310 to immediately resolve a design rule error that is found. If the design rule error is successfully resolved, the operational flow returns from block 3600 back to block 3300 to search for any additional design rule errors to resolve.

If it is determined at block 3600 that the detected design rule error cannot be resolved at block 3310, the flow proceeds to block 3610 where any changes to the interconnect solution for applying the pending action are discarded. At block 3620, a check is made to determine if any other actions possibly reducing the constraint instance's cost factor are available. If so, the flow returns via block 3210, where another action is selected, then applied at block 3200. If at block 3620 it is found that all possible actions have been exhausted, the pending optimization attempt for the constraint instance is deemed unsuccessful at block 3630, and the cost reduction loop is then exited.

Upon a successful application of an action, with a confirmation at block 3300 that no design rule errors exist (or have otherwise been resolved), a check is made at block 3400 for any constraint instances which may have become non-compliant as a result of the applied action. That is, a check is made in the disclosed embodiment for any constraint instances whose resource status values, at its compliance level, exceeds the resource limit.

If any non-compliance is found at block 3400, the cost reduction loop 3000 is recursively applied at block 3410 for the non-compliant constraint instance. Possible remedial actions to reduce the cost value for this particular constraint instance are sought and applied, with the subsequent checks made for design rule errors and other non-compliances due thereto. Where such recursive application of the cost reduction loop proves successful, the original flow resumes with block 3600 returning the flow back to block 3300 to check for and resolve any further design rule errors and non-compliances as before. Where the recursive application of the cost reduction loop fails, all pending actions are undone (changes discarded) at block 3610, and another action to apply is sought at block 3620, flow accordingly resuming from there.

Once it is determined that no non-compliant constraint instances remain, the flow proceeds next to block 3500 where a check is made for any cost increases which may have occurred due to any one of the prior operations in the cost reduction loop. The total system cost is computed toward this end, combining the cost factor contributions of each constraint instance. As described in preceding paragraphs, the total system cost is preferably computed as a sum of the individual constraint instance cost factors, respectively weighted in predetermined manner.

If an increase in total system cost is noted, at least one constraint instance to which the cost increase may be partially or wholly attributed is selected, and the cost reduction loop 3000 is recursively applied at block 3410 for this constraint instance. Possible remedial actions to reduce the cost value for this constraint instance are sought and applied, with the subsequent checks made for design rule errors and other non-compliances due thereto. If this recursive application of the cost reduction loop proves successful, the flow again resumes from block 3300 to check for and resolve any further design rule errors and non-compliances as before. Where the recursive application of the cost reduction loop fails, all pending actions are undone (changes discarded) at block 3610, and another action to apply is sought at block 3620, the flow progressing accordingly from there.

In the absence of any cost increases, all changes due to the applied actions are incorporated in the design database at block 3700. Success is declared for the cost reduction attempt at block 3710, and the loop exited.

In the disclosed embodiment, a multi-metric approach is taken to evaluate the impact of a possible optimizing action both in terms of compliance and quantified cost. A multi-level approach is also taken, whereby the effect of an over-constraining goal level is evaluated in contemplation of updating the pending compliance level in accordance therewith. In certain alternate embodiments of the present invention, the multiple metrics may be reflected in a combined metric—for example, by eliminating the compliance metric and assigning a larger positive value to the cost function whenever the desired compliance level fails to be met.

In certain other alternate embodiments, a fully routed, fully compliant interconnect solution need not be the starting point of the disclosed optimization. One or more of the constraint instances may, perhaps, be under-constrained initially, with compliance levels at the start set below 100%. Where the requirements of the intended application and available resources so permit, optimization would then proceed to attempt over-constraining from that point on.

The preferred requirement of preserving the compliance of all constraint instances at all times may be relaxed in still other alternate embodiments. Accordingly, some noncompliance may be tolerated to afford the tightening of certain constraints of particular significance. This would heighten the risk of an unrealizable interconnect solution, or may at least make for a more elusive interconnect solution. Consequently, additional measures to safeguard against non-convergent results, or to effect residual design rule violations, for instance, may be required.

The cost reduction loop may be sequentially executed as disclosed, with its tests and actions applied one after another. Normally, the possible routing actions are fully evaluated in turn until an acceptable one is identified and accepted. One variation would be to take a less sequential approach in evaluating the possible routing actions. For example, more than one possible routing action may be identified and collected before further evaluation is made on any. As the evaluation unfolds for the 'collected' actions, their competing results (such as the respective total system costs they yield) could be compared for selection of the most favorable action. The process is likely to be slower and consume more processing resources, but also likely yield greater optimization.

In the disclosed embodiment, the optimizer and its operational features are shown and described apart from the autorouter that is employed. Certainly, the optimizer may be implemented as a separate unit suitably coupled to the autorouter. The optimizer may alternatively be either partially or wholly integrated in the autorouter, with the various optimizing features programmed in its main autorouting engine. The present invention is not limited to any particular choice of actual implementation in this regard.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of method features may be reversed or interposed, all without departing from the spirit or scope of the invention as defined in the appended claims.

What is claimed is:

1. A method for selectively optimizing a circuit design for physical implementation comprising:
    (a) generating a circuit routing solution, by a processor, in accordance with a plurality of constraints for parametric resources of the circuit design, said constraints being defined respectively by a plurality of corresponding constraint instances, each said constraint instance variably indicating a constraining limit and degree of resource consumption for at least one of said parametric resources;
    (b) selectively adjusting, by a processor, at least one of said constraints by an over-constraining amount;
    (c) preliminarily modifying, by a processor, said circuit routing solution by applying at least one routing action selected responsive to said constraint adjustment;
    (d) evaluating potential impact upon constraint compliance, by a processor, said evaluation including generating a relative cost measure for said preliminary modification of said circuit routing solution, based at least partially upon each of said constraint instances;
    (e) alternatively discarding or accepting, by a processor, said preliminary modification of said circuit routing solution responsive to said evaluation, whereby acceptance of said preliminary modification is conditioned upon measurable validation of favorable constraint compliance impact associated therewith; and,
    (f) optionally repeating (b)-(e) in recursive manner.

2. The method as recited in claim 1, wherein said evaluation at (d) includes detection of any non-compliance in said constraint instances, said non-compliance being determined responsive to a predefined compliance function characterizing at least a compliant state and a non-compliant state based upon said degree of parametric resource consumption relative to a constraining limit applicable thereto.

3. The method as recited in claim 2, wherein said compliance function is a Boolean function characterized by a stepped curve transitioning from compliance and non-compliance states at said constraining limit.

4. The method as recited in claim 2, wherein said evaluation at (d) further includes recursively executing (b)-(e) with reference to each said constraint instance detected to be non-compliant or to have a predetermined adverse effect upon said relative cost measure.

5. The method as recited in claim 1, wherein each said constraint instance includes for at least one said constraint:
    a preset resource limit;
    a compliance level adjustably defining a constraining limit relative to said resource limit;
    a goal level adjustably defining an effective constraining limit relative to said resource limit; and,
    a resource status variably indicating said degree of consumption of said parametric resource;
    said predetermined over-constraining amount being indicative of a difference between said goal and compliance levels.

6. The method as recited in claim 1, wherein said circuit routing solution of (a) is initially generated by an autorouting engine to be in full compliance, whereby by said degree of parametric resource consumption exceeds a constraining limit applicable thereto in each of said constraint instances.

7. The method as recited in claim 1, wherein (c)-(e) are repeated recursively for a plurality of said routing actions until said relative cost measure is reduced relative to a prior set value, or said routing actions are otherwise exhausted.

8. The method as recited in claim 1, wherein (b)-(e) are repeated recursively for a plurality of adjustment attempts for at least one of said constraints at successively varied over-constraining amounts, until said relative cost measure is reduced relative to a prior set value, or said adjustment attempts are otherwise exhausted.

9. The method as recited in claim 5, wherein said relative cost measure is determined based upon a sum of cost factors respectively generated for said constraint instances, each said cost factor being determined by a cost function sloped in substantially linear manner for values of said resource status approximately equal to or greater than said effective constraining limit.

10. The method as recited in claim 5, wherein said relative cost measure is determined based upon a sum of cost factors respectively generated for said constraint instances, each said cost factor being determined by a cost function generally defining a sigmoid curve exhibiting maximal variation in amplitude for values of said resource status substantially at or around said effective constraining limit.

11. The method as recited in claim 5, wherein said relative cost measure is determined based upon a selectively weighted sum of cost factors respectively generated for said constraint instances, each said cost factor being determined by a cost function characterized by a curve exhibiting maximal variation in amplitude for values of said resource status substantially at or around said effective constraining limit.

12. The method as recited in claim 5, wherein said compliance level and goal levels are each expressed as a proportional value relative to said resource limit, an over-constrained condition being indicated by a compliance level greater than unity, an under-constrained condition being indicated by a non-zero compliance level less than unity, and an unconstrained condition being indicated by a compliance level of zero.

13. The method as recited in claim 12, wherein said constraining limit of each said constraint instance is determined as a mathematic product of said compliance level and said resource limit; and, said effective constraining limit of each said constraint instance is determined as a mathematic product of said goal level and said resource limit.

14. The method as recited in claim 1, wherein said circuit routing solution of (a) is initially generated by an autorouting engine; and, said evaluation of (d) includes detection of any violation of a predefined design rule applicable to physical implementation of the circuit design; resolution of each detected violation being attempted by executing at least one error resolution process of said autorouting engine.

15. The method as recited in claim 1, wherein a plurality of said constraints are selectively adjusted by a predetermined over-constraining amount.

16. The method as recited in claim 15, wherein said at least a pair of said constraints selectively adjusted by a predetermined over-constraining amount are adjustable one independent of the other.

17. A method for selectively optimizing a circuit design for physical implementation comprising:
(a) executing an autorouting engine, by a processor, to generate a circuit routing solution in accordance with a plurality of constraints for parametric resources of the circuit design, said constraints being defined respectively by a plurality of corresponding constraint instances, each said constraint instance including for at least one said constraint: a preset resource limit defining a minimum or maximum threshold for said parametric resource; a compliance level adjustably defining a constraining target limit relative to said resource limit; a goal level adjustably defining a constraining limit relative to said resource limit; and, a resource status variably indicating a degree of resource consumption of said parametric resource;
(b) selectively adjusting, by a processor, said goal level of at least one of said constraints by a predetermined over-constraining amount;
(c) preliminarily modifying, by a processor, said circuit routing solution by applying at least one routing action selected responsive to said constraint adjustment;
(d) evaluating, by a processor, potential impact upon constraint compliance, said evaluation including:
(1) detecting any violation of a predefined design rule applicable to physical implementation of the circuit design;
(2) detecting any non-compliance in said constraint instances, said non-compliance being indicated by said degree of parametric resource consumption in said constraint instance surpassing said constraining limit thereof; and,
(3) generating a relative cost measure for said preliminary modification of said circuit routing solution, based at least partially upon each of said constraint instances;
(e) alternatively discarding or accepting, by a processor, said preliminary modification of said circuit routing solution responsive to said evaluation, said compliance level of said constraint modified at (b) being updated to equal said goal level in value upon acceptance of said preliminary modification; and,
(f) optionally repeating (b)-(e) in recursive manner.

18. The method as recited in claim 17, wherein said evaluation of (d) further includes:
attempting resolution of each detected violation by executing at least one error resolution process of said autorouting engine; and,
recursively executing (b)-(e) with reference to each said constraint instance detected to be non-compliant or to have a predetermined adverse effect upon said relative cost measure.

19. The method as recited in claim 18, wherein (c) and (d) are executed in a recursively repeatable cost reduction loop, whereby reduction of said relative cost measure for the circuit design is attempted.

20. The method as recited in claim 18, wherein (c)-(e) are repeated recursively for a plurality of said routing actions until said relative cost measure is reduced relative to a prior set value, or said routing actions are otherwise exhausted.

21. The method as recited in claim 18, wherein each of the operations at (c) and (d) is executed for a plurality of said routing actions prior to execution of (e) for any; one of said plurality of routing actions being selected at (e) exclusive of the others responsive to comparison of said relative cost measures corresponding thereto.

22. The method as recited in claim 18, wherein (b)-(e) are repeated recursively for a plurality of adjustment attempts for at least one of said constraints at successively varied over-constraining amounts, until said relative cost measure is reduced relative to a prior set value, or said adjustment attempts are otherwise exhausted.

23. The method as recited in claim 18, wherein said relative cost measure is determined based upon a selectively weighted sum of cost factors respectively generated for said constraint instances, each said cost factor being determined by a cost function characterized by a curve exhibiting maximal variation in amplitude for values of said resource status substantially at or around said effective target constraining limit.

24. The method as recited in claim 17, wherein a plurality of said constraints are selectively adjusted by a predetermined over-constraining amount.

25. The method as recited in claim 24, wherein said at least a pair of said constraints selectively adjusted by a predetermined over-constraining amount are adjustable one independent of the other.

26. A system for selectively optimizing a circuit design for physical implementation comprising:
 (a) an autorouter operable to generate a circuit routing solution in accordance with a plurality of constraints for parametric resources of the circuit design; said constraints being defined respectively by a plurality of corresponding constraint instances, each said constraint instance variably indicating a constraining limit and degree of resource consumption for at least one of said parametric resources;
 (b) an optimizer coupled to said autorouter, said optimizer including a programmably configured processor operable to execute processing including:
  (1) selectively adjusting at least one of said constraints by a predetermined over-constraining amount;
  (2) preliminarily modifying said circuit routing solution by applying at least one routing action selected responsive to said constraint adjustment;
  (3) automatically evaluating potential impact upon constraint compliance, said evaluation including generating a relative cost measure for said preliminary modification of said circuit routing solution, based at least partially upon each of said constraint instances;
  (4) alternatively discarding or accepting said preliminary modification of said circuit routing solution responsive to said evaluation, whereby acceptance of said preliminary modification is conditioned upon measurable validation of favorable constraint compliance impact associated therewith; and,
  (5) optionally repeating (1)-(4) in recursive manner.

27. The system as recited in claim 26, wherein at least one of said constraint instances includes: a preset resource limit defining a minimum or maximum threshold for said parametric resource; a compliance level adjustably defining a constraining limit relative to said resource limit; a goal level adjustably defining an effective constraining limit relative to said resource limit; and, a resource status variably indicating the degree of consumption of said parametric resource.

28. The system as recited in claim 27, wherein said optimizer is operable to execute said evaluation to include:
 i. detecting any violation of a predefined design rule applicable to physical implementation of the circuit design;
 ii. detecting any non-compliance in said constraint instances, said non-compliance being indicated by said degree of parametric resource consumption in said constraint instance surpassing said constraining limit thereof; and,
 iii. generating a relative cost measure for said preliminary modification of said circuit routing solution, based at least partially upon each of said constraint instances.

29. The system as recited in claim 28, wherein said compliance level of said modified constraint is updated by said optimizer to equal said goal level in value upon acceptance of said preliminary modification.

30. The system as recited in claim 26, wherein said optimizer is programmably incorporated in a processing unit coupled to an autorouting engine of said autorouter.

31. The system as recited in claim 26, wherein said optimizer is programmably incorporated within an autorouting engine of said autorouter.

32. The system as recited in claim 26, wherein said relative cost measure is determined based upon a selectively weighted sum of cost factors respectively generated for said constraint instances, each said cost factor being determined by a cost function characterized by a curve exhibiting maximal variation in amplitude for values of said resource status substantially at or around said effective constraining limit.

33. The system as recited in claim 32, wherein said cost function sloped in substantially linear manner for values of said resource status approximately equal to or greater than said effective constraining limit; said cost function including a factor generally defined by:

$$c(s) \equiv \begin{cases} 0, & \text{if } s < \text{floor} \\ s*a+b, & \text{if } s \geq \text{floor} \end{cases}$$

wherein s represents said resource status, and a, b, and floor represent constant values selectively set based at least in part upon said effective goal level and said resource limit of said constraint instance.

34. The system as recited in claim 32, wherein said cost function defines substantially a sigmoid curve, said cost function including a factor generally defined by:

$$c(s) = \frac{1}{1+e^{-s}}$$

wherein s represents said resource status, and said factor is incorporated in a manner dependent upon said goal level and said resource limit of said constraint instance.

* * * * *

UNITED STATES PATENT AND TRADEMARK OFFICE
CERTIFICATE OF CORRECTION

PATENT NO. : 7,620,922 B1  Page 1 of 1
APPLICATION NO. : 11/556999
DATED : November 17, 2009
INVENTOR(S) : Wadland et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 284 days.

Signed and Sealed this

Twenty-sixth Day of October, 2010

David J. Kappos
*Director of the United States Patent and Trademark Office*